US012747501B2

(12) United States Patent
Sasaki et al.

(10) Patent No.: US 12,747,501 B2
(45) Date of Patent: Sep. 29, 2026

(54) SUBSTRATE PROCESSING APPARATUS, METHOD OF MANUFACTURING SEMICONDUCTOR DEVICE, METHOD OF PROCESSING SUBSTRATE, AND RECORDING MEDIUM

(71) Applicant: Kokusai Electric Corporation, Tokyo (JP)

(72) Inventors: Takafumi Sasaki, Toyama (JP); Sadayoshi Horii, Toyama (JP); Mika Urushihara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 672 days.

(21) Appl. No.: 18/186,333

(22) Filed: Mar. 20, 2023

(65) Prior Publication Data

US 2023/0227979 A1 Jul. 20, 2023

Related U.S. Application Data

(63) Continuation of application No. PCT/JP2021/033958, filed on Sep. 15, 2021.

(30) Foreign Application Priority Data

Sep. 25, 2020 (JP) ................................ 2020-161403

(51) Int. Cl.
*C23C 16/455* (2006.01)
*C23C 16/40* (2006.01)
(Continued)

(52) U.S. Cl.
CPC ...... *C23C 16/45565* (2013.01); *C23C 16/402* (2013.01); *C23C 16/4412* (2013.01);
(Continued)

(58) Field of Classification Search
CPC .............. C23C 16/52; C23C 16/45563; C23C 16/45578; C23C 16/45574
See application file for complete search history.

(56) References Cited

U.S. PATENT DOCUMENTS

2006/0183343 A1 8/2006 Suzuki et al.
2009/0117259 A1 5/2009 Kataoka et al.
(Continued)

FOREIGN PATENT DOCUMENTS

JP 2005-268755 A 9/2005
JP 2009-245984 A 10/2009
(Continued)

OTHER PUBLICATIONS

International Search Report, PCT/JP2021/033958, Oct. 26, 2021, 5 pgs.

*Primary Examiner* — Joseph A Miller, Jr.
(74) *Attorney, Agent, or Firm* — Volpe Koenig

(57) ABSTRACT

There is provided a technique that includes: a first nozzle arranged to correspond to a first region where a plurality of product substrates are arranged in a substrate arrangement region where a plurality of substrates are arranged in a reaction tube, the first nozzle supplying a hydrogen-containing gas into the reaction tube; a second nozzle arranged to correspond to the first region and supplying an oxygen-containing gas into the reaction tube; a third nozzle arranged closer to the bottom opening than the first region to correspond to a second region where a dummy substrate or a heat insulator or both is arranged, the third nozzle supplying a dilution gas into the reaction tube; and a controller configured to be capable of controlling the hydrogen-containing gas and the dilution gas so that a concentration of the hydrogen-containing gas in the second region is lower than that in the first region.

15 Claims, 11 Drawing Sheets

(51) Int. Cl.

| | |
|---|---|
| ***C23C 16/44*** | (2006.01) |
| ***C23C 16/52*** | (2006.01) |
| ***H10P 14/60*** | (2026.01) |
| ***H10P 14/692*** | (2026.01) |

(52) U.S. Cl.

CPC ........ *C23C 16/45519* (2013.01); *C23C 16/52* (2013.01); *H10P 14/6334* (2026.01); *H10P 14/69215* (2026.01)

(56) References Cited

U.S. PATENT DOCUMENTS

| | | | | |
|---|---|---|---|---|
| 2009/0130829 | A1* | 5/2009 | Noda | C23C 16/0227 257/E21.101 |
| 2010/0035440 | A1* | 2/2010 | Fukuda | C23C 16/401 118/724 |
| 2011/0065286 | A1 | 3/2011 | Sasaki et al. | |
| 2013/0157474 | A1 | 6/2013 | Yuasa et al. | |
| 2015/0140835 | A1* | 5/2015 | Tateno | H01L 21/67109 118/724 |
| 2016/0168704 | A1* | 6/2016 | Choi | C23C 16/45546 156/345.33 |
| 2016/0322217 | A1 | 11/2016 | Fukuda et al. | |

FOREIGN PATENT DOCUMENTS

| | | | |
|---|---|---|---|
| JP | 2010-062528 | A | 3/2010 |
| JP | 2010-087167 | A | 4/2010 |
| JP | 2010-147265 | A | 7/2010 |
| JP | 2010-147432 | A | 7/2010 |
| JP | 2011-014688 | A | 1/2011 |
| JP | 2011-066219 | A | 3/2011 |
| JP | 2011-071412 | A | 4/2011 |
| JP | 2011-187884 | A | 9/2011 |
| JP | 2013-110432 | A | 6/2013 |
| JP | 2013-197116 | A | 9/2013 |
| JP | 2013-197207 | A | 9/2013 |
| JP | 2013-197208 | A | 9/2013 |
| JP | 2013-197421 | A | 9/2013 |
| WO | 2012/018008 | A1 | 2/2012 |
| WO | 2016/046947 | A1 | 3/2016 |

* cited by examiner

SUBSTRATE PROCESSING APPARATUS, METHOD OF MANUFACTURING SEMICONDUCTOR DEVICE, METHOD OF PROCESSING SUBSTRATE, AND RECORDING MEDIUM

CROSS-REFERENCE TO RELATED APPLICATION

This application is a Bypass Continuation Application of PCT International Application No. PCT/JP2021/033958, filed on Sep. 15, 2021, the international application being based upon and claiming the benefit of priority from Japanese Patent Application No. 2020-161403, filed on Sep. 25, 2020, the entire contents of which are incorporated herein by reference.

TECHNICAL FIELD

The present disclosure relates to a substrate processing apparatus, a method of manufacturing a semiconductor device, a method of processing a substrate, and a recording medium.

BACKGROUND

A manufacturing process of a semiconductor device is a process of forming an oxide film on a surface of a substrate in a reaction tube. In the oxide film-forming process, a plurality of substrates may be loaded into a reaction chamber with a space therebetween and be processed simultaneously.

Due to the fact that a plurality of substrates are arranged at different locations in a reaction chamber, thicknesses of oxide films formed on the substrates may be different (loading effect). To address this matter, uniformity of the concentration of an oxidizing gas in the reaction chamber may be maintained. For this reason, it is conceivable to regulate a flow rate of a gas supplied into the reaction chamber, but further research may be performed to improve the uniformity of the film thickness.

SUMMARY

The present disclosure was made in consideration of the above-described fact and provides a technique capable of improving uniformity of a thickness of an oxide film regardless of an arrangement position of a substrate.

According to some embodiments of the present disclosure, there is provided a technique that includes: a reaction tube including a bottom opening through which a plurality of substrates are loaded and unloaded, the reaction tube being configured to process the plurality of substrates held by a holder in a substrate arrangement region; a first nozzle arranged to correspond to a first region in which a plurality of product substrates are arranged in the substrate arrangement region, the first nozzle being configured to supply a hydrogen-containing gas into the reaction tube from a plurality of locations corresponding to the first region; a second nozzle arranged to correspond to the first region, the second nozzle being configured to supply an oxygen-containing gas into the reaction tube from a position corresponding to the first region; a third nozzle arranged closer to the bottom opening than the first region to correspond to a second region in which a dummy substrate or a heat insulator or both held by the holder is arranged, the third nozzle being configured to supply a dilution gas into the reaction tube from a position corresponding to the second region, an exhaust port configured to exhaust an interior of the reaction tube, and a controller configured to be capable of controlling the hydrogen-containing gas supplied from the first nozzle and the dilution gas supplied from the third nozzle such that a concentration of the hydrogen-containing gas in the second region is lower than a concentration of the hydrogen-containing gas in the first region, wherein the first nozzle includes a plurality of multi-hole nozzles including injection holes corresponding to a divided region obtained by dividing a region including the first region and not including the second region in a substrate arrangement direction.

DETAILED DESCRIPTION

Figure 1:
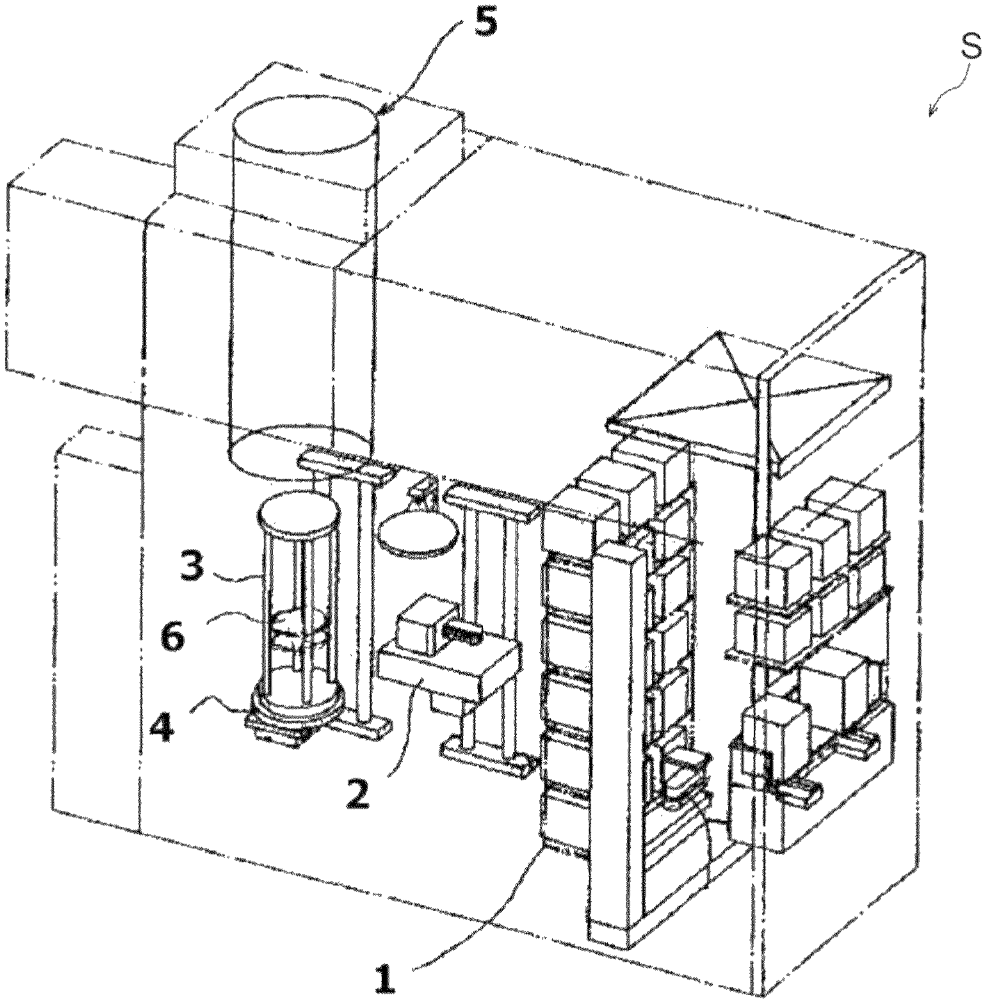
FIG. 1 is a perspective view illustrating an overall view of a substrate processing apparatus.

The present discloser and the like focused on an issue that the thicknesses of formed films are different between arrangement positions near a dummy substrate or a heat insulator arranged together with a substrate in a reaction tube and other arrangement positions. Then, since a product wafer is larger in film-forming area for each wafer than the dummy substrate, an amount of an atomic oxygen group consumed per unit time during film-formation in a region where the dummy substrate is arranged is different from that in a region where the product wafer is arranged. It was found that, for this reason, a film thickness of the product wafer arranged near the dummy substrate is different from a film thickness of the product wafer that is not arranged near the dummy substrate.

First Embodiment

Hereinafter, a first embodiment of the present disclosure will be described with reference to the drawings. The drawings used in the following description are schematic, and dimensional relationships, ratios, and the like of the respective constituents shown in the drawings may not match the actual ones. Further, dimensional relationships, ratios, and the like of the respective constituents among plural drawings may not match one another.

FIG. 1 illustrates an overall view of a substrate processing apparatus S. The substrate processing apparatus S includes a pod stocker 1 on which a wafer pod is mounted, a boat 3, a wafer transfer (transfer machine) 2 which transfers a wafer between the wafer pod mounted on the pod stocker 1 and the boat 3, a boat elevator 4 which inserts and withdraws the boat 3 into and out of a heat treatment furnace 5, and the heat treatment furnace 5 including a heater.

Figure 2:
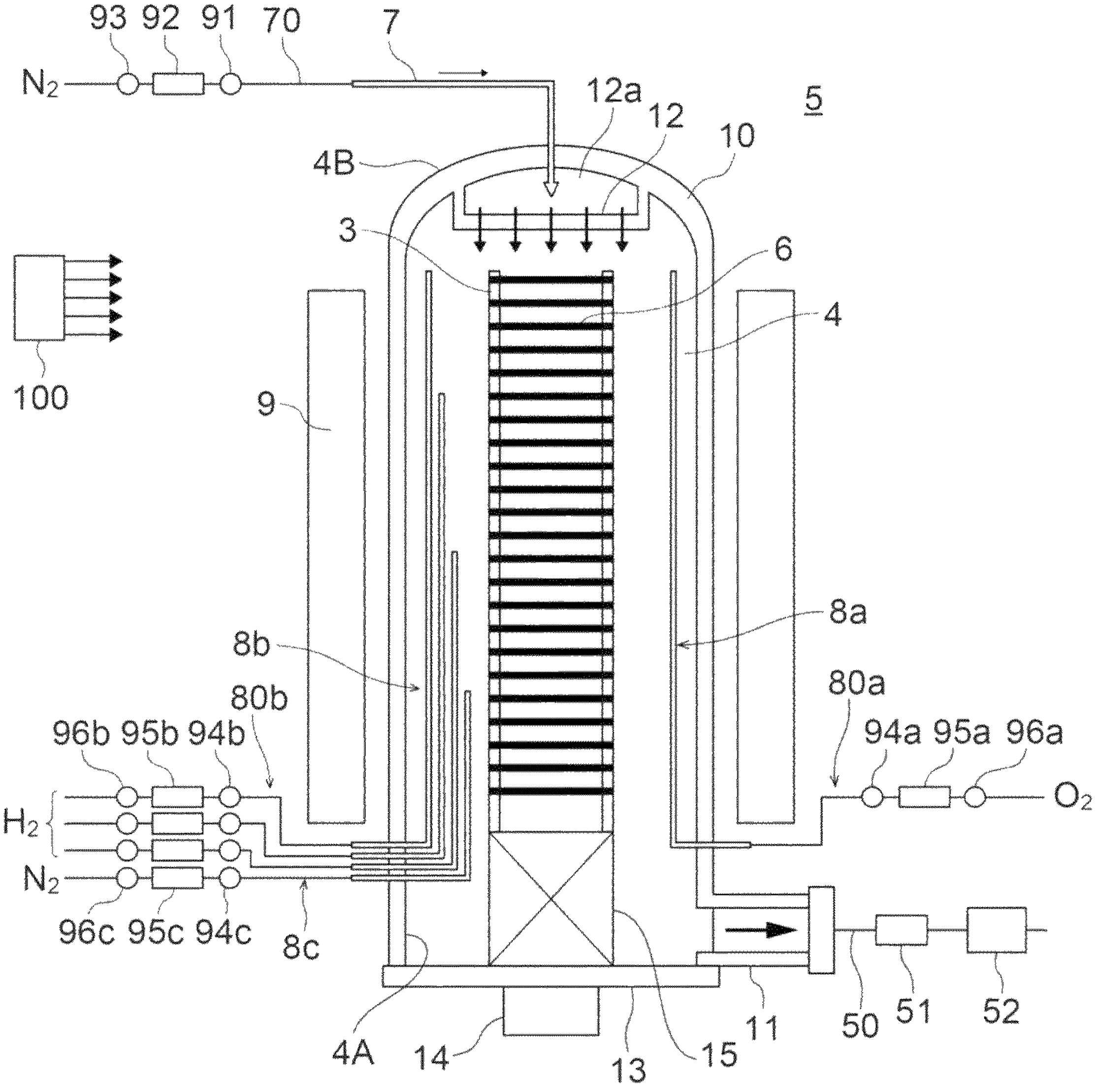
FIG. 2 is a schematic cross-sectional view illustrating a structure of a heat treatment furnace of a substrate processing apparatus.

FIG. 2 shows a schematic cross-sectional view illustrating a structure of the heat treatment furnace 5. The top and bottom in FIG. 2 correspond to the vertical direction, and a description of the top and bottom in the embodiments of the present disclosure means the top and bottom in the vertical direction.

As illustrated in FIG. 2, the heat treatment furnace 5 includes a resistance-heating heater 9 as a heating source. The heater 9 is formed in a cylindrical shape and is installed vertically by being supported by a heater base (not illustrated). A reaction tube 10 is arranged concentrically with the heater 9 inside the heater 9. A process chamber (reaction chamber) 4 configured to process a substrate is formed in the reaction tube 10, and is configured such that the boat 3 as a substrate holder is loaded therein. The boat 3 is configured to hold wafers 6, such as silicon wafers, which are a plurality of substrates, in such a state that the wafers 6 are arranged substantially in a horizontal posture and in multiple stages with a gap (substrate pitch interval) therebetween. In the following description, the highest wafer support position in the boat 3 is designated as #120, and the lowest wafer support position is designated as #1. Further, the wafer 6, which is held at the $n^{th}$ support position from the lowest wafer support position in the boat 3, is designated as wafer #n. In addition, the wafer support position referred to herein may include a position where a dummy substrate or a heat insulating plate to be described later as well as the wafer 6 is supported. A gap between the heat insulating plate support positions may be different from a gap between wafer support positions where the wafers 6 are supported.

A bottom opening 4A configured to insert the boat 3 is formed and open below the reaction tube 10. An open side (bottom opening 4A) of the reaction tube 10 is configured to be sealed by a seal cap 13. A heat insulating cap 15 is installed on the seal cap 13 to support the boat 3 from below. The heat insulating cap 15 is attached to a rotator 14 via a rotation shaft (not illustrated) installed to pass through the seal cap 13. The rotator 14 is configured to rotate the wafer 6 supported by the boat 3 by rotating the heat insulating cap 15 and the boat 3 via the rotation shaft. In a case where the heat insulating plate is arranged at the lower stage of the boat 3, the heat insulating cap 15 may not be provided.

A shower plate 12 is attached to a wall of a ceiling 4B, which is a closed end opposite to the bottom opening 4A of the reaction tube 10, and a buffer chamber 12*a* is defined by the ceiling wall of the reaction tube 10 and the shower plate 12. An inert gas supply nozzle 7 configured to supply an inert gas as a dilution gas to the wafer 6 from the top in the reaction chamber 4 is connected to the top of the reaction tube 10 such that the nozzle 7 is in fluid communication with the interior of the buffer chamber 12*a*. A gas injection port of the inert gas supply nozzle 7 faces downward and is configured to inject the inert gas from the top to the bottom in the reaction chamber 4 (along a wafer loading direction). The inert gas supplied from the inert gas supply nozzle 7 is directed into the buffer chamber 12*a* and is supplied into the reaction chamber 4 via the shower plate 12. The shower plate 12 forms a gas supply port through which the inert gas is supplied in a shower form from one end to the other end of a wafer arrangement region in which a plurality of wafers 6 are arranged. A ceiling gas supplier includes the shower plate 12 and the buffer chamber 12*a*.

As the inert gas, for example, a nitrogen ($N_2$) gas, or a noble gas such as an argon (Ar) gas, a helium (He) gas, a neon (Ne) gas, and a xenon (Xe) gas may be used. One or more selected from the group of these gases may be used as the inert gas. This also applies to other inert gases to be described later.

An inert gas supply pipe 70 as an inert gas supply line is connected to the inert gas supply nozzle 7. The inert gas supply pipe 70 is provided with an inert gas source (not illustrated), an on/off valve 93, a mass flow controller (MFC) 92 as a flow rate control means or unit (flow rate controller), and an on/off valve 91 in this order from the upstream side.

A hydrogen-containing gas supply nozzle 8*b* configured to supply a hydrogen-containing gas to the wafer 6 from the lateral side in the reaction chamber 4 is connected to a lateral lower side of the reaction tube 10 such that the nozzle 8*b* penetrates a sidewall of the reaction tube 10. The hydrogen-containing gas supply nozzle 8*b* is arranged in a region corresponding to a wafer arrangement region PW as a first region, that is, in a cylindrical region which faces the wafer arrangement region PW in the reaction tube 10 and surrounds the wafer arrangement region PW. The hydrogen-containing gas supply nozzle 8*b* includes a plurality of (three in the embodiments) L-shaped nozzles of different lengths, each of which is upright along an inner wall surface of the sidewall of the reaction tube 10 within the reaction tube 10.

As the hydrogen-containing gas, at least one selected from the group of hydrogen ($H_2$), water vapor ($H_2O$), and various hydronitrogen gases such as ammonia ($NH_3$), hydrazine ($N_2H_4$), diazene ($N_2H_2$), and $N_3H_8$, or a mixed gas thereof is exemplified.

In the embodiments of the present disclosure, the wafer arrangement region PW is a region in which product wafers are mainly arranged, and may be set to support positions #6 to #115, for example. Further, an upper dummy arrangement region SD-T on the side of a ceiling, which corresponds to a position where a side dummy substrate SD is supported by the holder 3, may be set to, for example, support positions #116 to #120. Further, a lower dummy arrangement region SD-U at a bottom opening side, which corresponds to a position where the side dummy substrate SD is supported by the holder 3, may be, for example, support positions #1 to #5.

Figure 3:
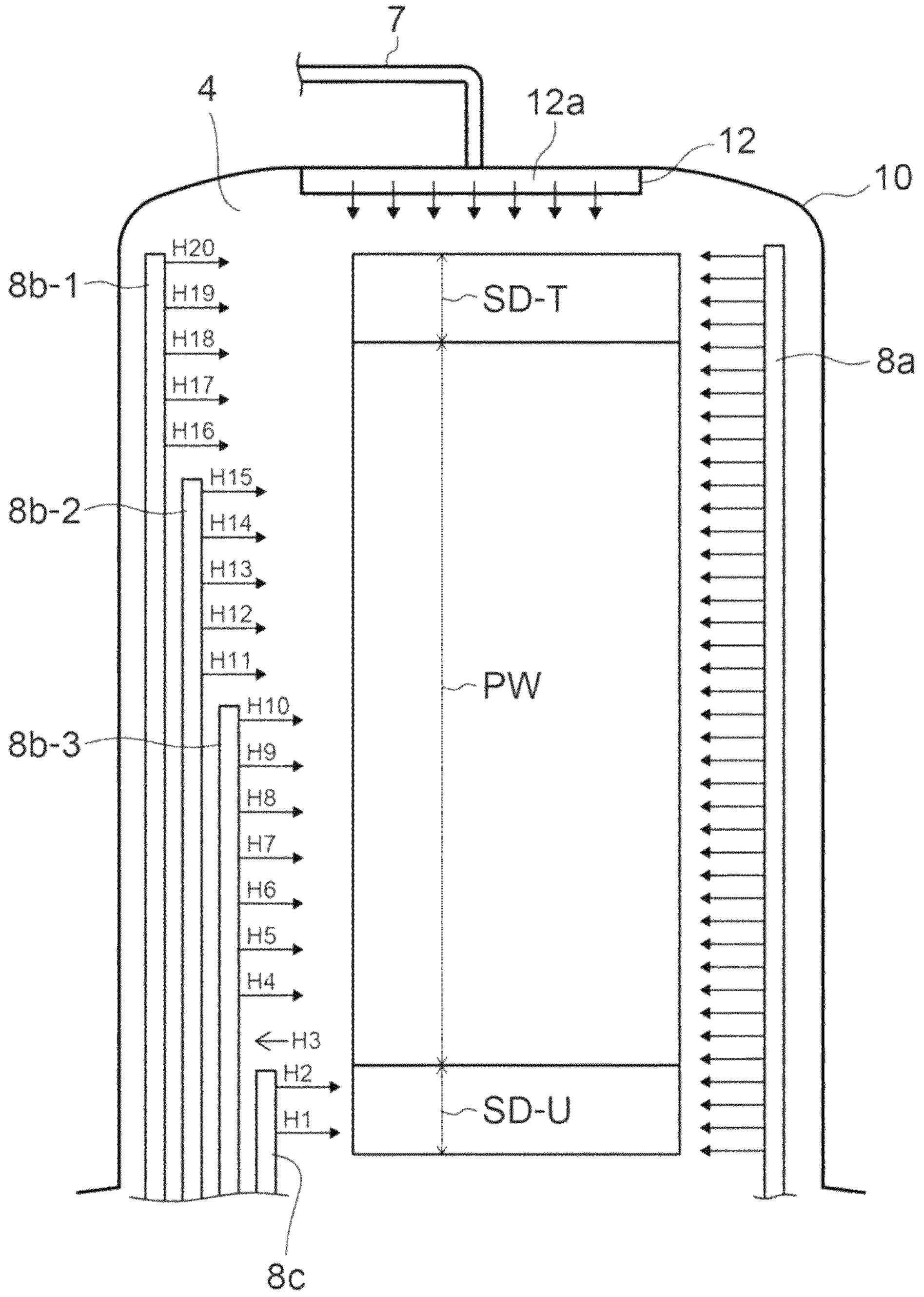
FIG. 3 is a schematic cross-sectional view illustrating an internal structure of a reaction tube of a substrate processing apparatus.

As also illustrated in FIG. 3, the plurality of nozzles constituting the hydrogen-containing gas supply nozzle 8*b* include at least one injection hole at different positions in a wafer arrangement direction. The hydrogen-containing gas is supplied into the reaction tube 10 from each of a plurality of divided regions, obtained by dividing a region corresponding to the wafer arrangement region PW and the upper dummy arrangement region SD-T in the wafer arrangement direction such that a concentration of hydrogen in the reaction chamber 4 may be regulated in the wafer arrangement direction (vertical direction). When the number of divisions is set to 3 and each of the plurality of nozzles includes one injection hole, the gas is supplied into the reaction tube 10 from three locations. In addition, the hydrogen-containing gas supply nozzle 8*b* is provided closer to the inner wall of the sidewall of the reaction tube 10 than the wafer 6, along the inner wall. The hydrogen-containing gas supply nozzle 8*b* constitutes a first nozzle.

Upper surfaces of tips of the plurality of nozzles constituting the hydrogen-containing gas supply nozzle 8*b* are respectively closed, and at least one, specifically, a plurality of gas injection holes are formed at a side surface of each nozzle tip end. In FIG. 3, the arrows extending from the hydrogen-containing gas supply nozzle 8*b* to the wafer 6 indicate an injection direction of the hydrogen-containing gas from each gas injection hole, and a root of each arrow indicates each gas injection hole. That is, the gas injection hole faces the wafer 6, and is configured to inject the hydrogen-containing gas from the lateral side in the reaction chamber 4 toward the wafer 6 in a horizontal direction (in a direction along the main surface of the wafer). Such a nozzle with a plurality of gas injection holes along a substrate arrangement direction is a kind of multi-hole nozzle. In addition, in the embodiments of the present disclosure, the longest nozzle (hereinafter, referred to as "hydrogen-containing gas supply nozzle 8*b*-1") is provided with five gas injection holes, and the second longest nozzle (hereinafter, referred to as "hydrogen-containing gas supply nozzle 8*b*-2") is provided with five gas injection holes, and the third longest nozzle (hereinafter, referred to as "hydrogen-containing gas supply nozzle 8*b*-3") is provided with seven gas injection holes. These plurality of (17 in the embodiments) gas injection holes are equidistantly formed in each nozzle.

The injection holes formed in the hydrogen-containing gas supply nozzles 8*b*-1, 8*b*-2, and 8*b*-3 are referred to as injection holes H4 to H20 in order from the bottom opening 4A. In the embodiments of the present disclosure, for example, as illustrated in FIG. 3, the injection holes H16 to H20 of the hydrogen-containing gas supply nozzle 8*b*-1 are formed to correspond to the divided region at the highest position, the injection holes H11 to H15 of the hydrogen-containing gas supply nozzle 8*b*-2 are formed to correspond to the divided region at the second highest position, and the injection holes H4 to H10 of the hydrogen-containing gas supply nozzle 8*b*-3 are formed to correspond to the divided region at the third highest position. In this way, the hydrogen-containing gas supply nozzles 8*b*-1, 8*b*-2, and 8*b*-3 divide the supply of the gas to the divided regions. In addition, product wafers may be arranged at a constant distance in the divided regions. Furthermore, the injection holes H4 to H20 may be equidistantly arranged, and the number of product wafers assigned to each injection hole may be a constant number greater than 1. Heights of the divided regions (lengths thereof in the wafer arrangement direction) are arbitrary. The heights of the divided regions may be different, respectively, or the heights of the divided regions excluding the divided region at the lowest position (that is, of the divided regions at the first highest and second highest positions) may be made equal. For example, the same number of substrates as the number of substrates (25) accommodated in one wafer pod may be arranged in these divided regions.

A hydrogen-containing gas supply pipe 80*b* as a hydrogen-containing gas supply line is connected to the hydrogen-containing gas supply nozzle 8*b*. The hydrogen-containing gas supply pipe 80*b* includes a plurality of (three in the embodiments) pipes, and is connected to each of the plurality of nozzles constituting the hydrogen-containing gas supply nozzle 8*b*. The hydrogen-containing gas supply pipe 80*b* is provided with a hydrogen-containing gas source (not illustrated), an on/off valve 96*b*, a mass flow controller (MFC) 95*b* as a flow rate control means or unit (flow rate controller), and an on/off valve 94*b* in this order from the upstream side. In addition, the on/off valve 96*b*, the mass flow controller 95*b*, and the on/off valve 94*b* are installed at each of the plurality of pipes constituting the hydrogen-containing gas supply pipe 80*b*, such that a flow rate of the hydrogen-containing gas may be independently controlled for each of the plurality of nozzles constituting the hydrogen-containing gas supply nozzle 8*b*.

In addition, a discharge balance of the hydrogen-containing gas from the injection holes H4 to H20 may be set such that a discharge flow rate for each of the injection holes H4 and H5 is about 1.3 times to 2.1 times larger than that of the injection holes H6 to H20. For example, the hydrogen-containing gas may be supplied at 168 sccm from each of the injection holes H4 and H5, and supplied at 100 sccm from each of the injection holes H6 and H20.

In the embodiments of the present disclosure, the discharge flow rate of the equidistant injection holes is controlled, but the discharge flow rate may be controlled by forming openings (injection holes) or distances differently such that a discharge flow rate per unit length monotonously increases.

An inert gas supply nozzle 8*c*, which is shorter than the hydrogen-containing gas supply nozzle 8*b*-3, is connected to a lateral lower side of the reaction tube 10 such that the nozzle 8*c* penetrates the sidewall of the reaction tube 10. The inert gas supply nozzle 8*c* is arranged closer to the bottom opening 4A than the wafer arrangement region PW, in a cylindrical region which faces a region in which a dummy substrate or a heat insulator held by the boat 3 is arranged (hereinafter, referred to as "lower dummy arrangement region SD-U") and surrounds the lower dummy arrangement region SD-U. The inert gas supply nozzle 8*c* constitutes a third nozzle.

An upper surface of a tip of the inert gas supply nozzle 8*c* is closed, and at least one (two in the embodiments) gas injection hole is formed at a side surface of a nozzle tip end. In FIG. 3, the arrows extending from the inert gas supply nozzle 8*c* to the lower dummy arrangement region SD-U indicate an injection direction of the inert gas from each gas injection hole, and a root of each arrow indicates each gas injection hole. That is, the gas injection hole faces the lower dummy arrangement region SD-U, and is configured to inject the inert gas as the dilution gas toward the dummy wafer or the heat insulating plate from the lateral side in the reaction chamber 4 in the horizontal direction (in the direction along the main surface of the wafer).

Two injection holes formed at the inert gas supply nozzle 8*c* are referred to as injection holes H1 and H2 from the bottom opening 4A. When the largest one of distances between adjacent ones of the injection holes H4 to H20 is a distance $D_M$ and a distance between the injection holes H1 and H2 is a distance $D_{1-2}$, a distance $D_{2-4}$ between the injection holes H2 and H4 is greater than any of the distance $D_M$ and the distance $D_{1-2}$. For example, the distance $D_{2-4}$ is twice the distance $D_M$. That is, it may be considered that there is a non-injection portion H3 where no hole is formed at a position with a distance M from each of the injection holes H2 and H4.

An inert gas supply pipe 80*c* as an inert gas supply line is connected to the inert gas supply nozzle 8*c*. The inert gas supply pipe 80*c* is provided with an inert gas source (not illustrated), an on/off valve 96*c*, a mass flow controller (MFC) 95*c* as a flow rate control means or unit (flow rate controller), and an on/off valve 94*c* in this order from the upstream side.

An oxygen-containing gas supply nozzle 8*a*, which supplies an oxygen-containing gas (oxidizing gas) to the wafer 6 from the lateral side in the reaction chamber 4, is connected to a lateral lower side of the reaction tube 10 such that the nozzle 8*a* penetrates the sidewall of the reaction tube 10. The oxygen-containing gas supply nozzle 8*a* is arranged in a region corresponding to the wafer arrangement region PW, that is, in a cylindrical region which faces the wafer arrangement region PW in the reaction tube 10 and surrounds the wafer arrangement region PW. The oxygen-containing gas supply nozzle 8*a* is constituted by an L-shaped nozzle and extends upright in the reaction tube 10 along the inner wall of the sidewall of the reaction tube 10. The oxygen-containing gas supply nozzle 8*a* is provided closer to the inner wall of the sidewall of the reaction tube 10 than the wafer 6, along the inner wall. The oxygen-containing gas supply nozzle 8*a* constitutes a second nozzle.

As the oxygen-containing gas, at least one selected from the group of oxygen ($O_2$), ozone ($O_3$), hydrogen peroxide ($H_2O_2$), and nitrogen monoxide (NO), or a mixed gas thereof may be used.

An upper surface of a tip of the oxygen-containing gas supply nozzle 8*a* is closed, and a gas injection hole is formed at a side surface of a nozzle tip end. In FIG. 3, the arrows extending from the oxygen-containing gas supply nozzle 8*a* to the wafer 6 indicate an injection direction of the oxygen-containing gas from each gas injection hole, and a root of each arrow indicates each gas injection hole. That is, the gas injection hole faces the wafer, and is configured to inject the oxygen-containing gas from the lateral side in the reaction chamber 4 toward the wafer 6 in the horizontal direction (in the direction along the main surface of the wafer). In addition, in the embodiments of the present disclosure, the nozzle includes injection holes, which correspond to the wafers 6 in an one-to-one relationship, that is, corresponding injection holes at the same pitch as a wafer support pitch defined in the boat 3. The injection holes of the oxygen-containing gas supply nozzle 8*a*, the hydrogen-containing gas supply nozzles 8*b*-1, 8*b*-2, and 8*b*-3, and the inert gas supply nozzle 8*c* may be formed to be open toward the center of the wafer 6, that is, the central axis of the reaction tube 10 in the horizontal direction.

An oxygen-containing gas supply pipe 80*a* as an oxygen-containing gas supply line is connected to the oxygen-containing gas supply nozzle 8*a*. The oxygen-containing gas supply pipe 80*a* is provided with an oxygen-containing gas source (not illustrated), an on/off valve 96*a*, a mass flow controller (MFC) 95*a* as a flow rate control means or unit (flow rate controller), and an on/off valve 94*a* in this order from the upstream side.

A gas exhaust port 11 is installed at a lateral lower side of the reaction tube 10 (below the lower dummy arrangement region SD-U) to exhaust the interior of the process chamber. A gas exhaust pipe 50 as a gas exhaust line is connected to the gas exhaust port 11. The gas exhaust pipe 50 is provided with an auto pressure controller (APC) 51 as a pressure regulating means or unit (pressure controller) and a vacuum pump 52 as an exhaust means or unit (exhauster) in this order from the upstream side. An exhaust system mainly includes the gas exhaust port 11, the gas exhaust pipe 50, the APC 51, and the vacuum pump 52.

Each constituent of the substrate processing apparatus, such as the resistance-heating heater 9, the mass flow controllers 92, 95*a*, 95*b*, and 95*c*, the on/off valves 91, 93, 94*a*, 94*b*, 96*a*, and 96*b*, the APC 51, the vacuum pump 52, and the rotator 14 is connected to a controller 100 as a control means or unit (control part), and the controller 100 is configured to be capable of controlling environment and operation of each constituent of the substrate processing apparatus, such as a flow rate of the hydrogen-containing gas supplied from the hydrogen-containing gas supply nozzle 8*b*, a flow rate of the oxygen-containing gas supplied from the oxygen-containing gas supply nozzle 8*a*, a flow rate of the inert gas supplied from the shower plate 12, a flow rate of the inert gas supplied from the inert gas supply nozzle 8*c*, and an internal temperature, an internal pressure, and the like of the reaction tube 10. The controller 100 is constituted as a computer including a CPU, a memory, a storage such as a HDD, a display such as a FPD, and an input device such as a keyboard or a mouse.

Next, a method of performing an oxidation processing on the wafer 6 as a substrate, as a method of manufacturing a semiconductor device, by using the heat treatment furnace 5 of the substrate processing apparatus S described above will be described. In addition, in the following description, an operation of each constituent constituting the substrate processing apparatus S is controlled by the controller 100.

First, one batch of the wafers 6 (for example, 100 wafers) are transferred to the wafer arrangement region PW of the boat 3 by a substrate transfer machine (wafer charge). Further, the side dummy substrates SD are loaded into the upper dummy arrangement region SD-T and the lower dummy arrangement region SD-U of the boat 3. The side dummy substrates SD are smaller in film-forming area per sheet than the wafers 6. The boat 3 where the wafers 6 and the side dummy substrates SD are loaded is loaded into the reaction chamber 4 of the heat treatment furnace 5, which is kept in a heated state by the heater 9 (boat loading), and the interior of the reaction tube 10 is sealed by the seal cap 13. Subsequently, the interior of the reaction tube 10 is vacuumized by the vacuum pump 52, and the internal pressure of the reaction tube 10 (in-furnace pressure) is controlled by the APC 51 to be a predetermined processing pressure lower than the atmospheric pressure. The boat 3 is rotated at a predetermined rotational speed by the rotator 14. Further, the internal temperature of the reaction chamber 4 (in-furnace temperature) is raised to control the in-furnace temperature to a predetermined processing temperature.

Then, the inert gas is supplied into the reaction chamber 4 from the inert gas supply nozzles 7 and 8*c*. That is, by opening the on/off valves 91 and 93, the inert gas with the flow rate controlled by the mass flow controller 92 is supplied into the reaction chamber 4 from the inert gas supply nozzle 7 via the inert gas supply pipe 70. The inert gas supplied from the inert gas supply nozzle 7 flows through the buffer chamber 12*a* and is supplied in a shower form into the reaction chamber 4 via the shower plate 12.

Further, the oxygen-containing gas, the hydrogen-containing gas, and the inert gas are supplied into the reaction chamber 4 from the oxygen-containing gas supply nozzle

8*a*, the hydrogen-containing gas supply nozzle 8*b*, and the inert gas supply nozzle 8*c*, respectively. That is, by opening the on/off valves 94*a* and 96*a*, the oxygen-containing gas with the flow rate controlled by the mass flow controller 95*a* is supplied into the reaction chamber 4 from the oxygen-containing gas supply nozzle 8*a* via the oxygen-containing gas supply pipe 80*a*. Further, by opening the on/off valves 94*b* and 96*b*, the hydrogen-containing gas with the flow rate controlled by the mass flow controller 95*b* is supplied into the reaction chamber 4 from the hydrogen-containing gas supply nozzle 8*b* via the hydrogen-containing gas supply pipe 80*b*. Further, by opening the on/off valves 94*c* and 96*c*, the inert gas with the flow rate controlled by the mass flow controller 95*c* is supplied into the reaction chamber 4 from the inert gas supply nozzle 8*c* via the inert gas supply pipe 80*c*. The oxygen-containing gas supplied from the oxygen-containing gas supply nozzle 8*a* and the hydrogen-containing gas supplied from the hydrogen-containing gas supply nozzle 8*b* are supplied into the reaction chamber 4 from a plurality of locations (a plurality of injection holes) in a region corresponding to the wafer arrangement region.

In this way, the oxygen-containing gas and the hydrogen-containing gas are supplied from the injection holes (discharge holes) corresponding to the wafer arrangement region in the reaction chamber 4 and are mixed in the reaction chamber. Further, the inert gas is supplied from one end (on the side of the ceiling) corresponding to the wafer arrangement region in the reaction chamber 4, and is also supplied from a plurality of injection holes corresponding to the lower dummy arrangement region SD-U below the wafer arrangement region PW in the reaction chamber 4. The oxygen-containing gas and the hydrogen-containing gas supplied into the reaction chamber 4 flow down, together with the inert gas, in the reaction chamber 4, and are exhausted from the gas exhaust port 11 installed on the side of the bottom opening 4A of the wafer arrangement region PW. The mixing of the oxygen-containing gas and the hydrogen-containing gas, which are injected from the oxygen-containing gas supply nozzle 8*a* and the hydrogen-containing gas supply nozzle 8*b* toward the center of the wafer, and generation of oxidizing species may occur in any of annular spaces between the arranged wafers and between the outer periphery of the wafer and the reaction tube 10. In this case, as for a rate of diffusion and convection in the movement of gas molecules from the rim to the center of the wafer, a convection rate of the oxygen-containing gas is higher than that of the hydrogen-containing gas. In other words, the hydrogen-containing gas is easily diffused, and is difficult to undergo a concentration difference near the center of the wafer even in a case where the injection holes are provided at different distances from those of the wafers.

In this case, the oxygen-containing gas and the hydrogen-containing gas are mixed and react with each other to produce $H_2O$ in the pressure-reduced reaction chamber 4 heated by the heater 9, but intermediate products such as H, O, and OH, which are intermediate products of this combustion reaction, also remain at a predetermined equilibrium concentration. Among these, a concentration of atomic oxygen O is relatively high. As described in the specification in Japanese Patent Application No. 2008-133772 filed by the present applicant, among these intermediate products, the atomic oxygen O directly contributes to the formation of an oxide film, and other intermediate products or $H_2O$ and the precursor gases themselves are not dominant in a surface reaction involved in the growth of the oxide film. That is, among the intermediate products produced by the reaction between the oxygen-containing gas and the hydrogen-containing gas, the atomic oxygen O acts as reactive species (oxidizing species), thereby oxidizing the wafer 6 and forming a silicon oxide film ($SiO_2$ film) as an oxide film on a surface of the wafer 6. In addition, the concentration of atomic oxygen O is expressed as an upwardly convex function with respect to a supply ratio of the oxygen-containing gas and the hydrogen-containing gas. The concentration of atomic oxygen O is lowered even when the ratio is lower or higher than the maximum point. The technique of this example of regulating an amount of supply from each injection hole of the hydrogen-containing gas supply nozzle 8*b* may be suitably used in a hydrogen-deficient state rather than at the maximum point. In the hydrogen-deficient state, the oxygen-containing gas itself may also be a dilution gas.

A processing condition (oxidation processing conditions) at this time is exemplified as follows:

- Processing temperature (internal temperature of the process chamber): 500 degrees C. to 1000 degrees C.;
- Processing pressure (internal pressure of the process chamber): 1 Pa to 500 Pa;
- Supply flow rate of the oxygen-containing gas supplied from the oxygen-containing gas supply nozzle 8*a:* 3.0 slm to 6.0 slm;
- Supply flow rate of the hydrogen-containing gas (total flow rate) supplied from the hydrogen-containing gas supply nozzle 8*b:* 1500 sccm to 3000 sccm;
- Supply flow rate of the inert gas supplied from the inert gas supply nozzle 8*c:* 1.0 slm to 1.5 slm; and
- Supply flow rate of the inert gas supplied from the shower plate 12: 400 sccm to 1000 sccm, and the wafer 6 is oxidized by constantly maintaining each processing condition at a certain value within each range.

When the oxidation processing of the wafer 6 is completed, the supply of the oxygen-containing gas and the hydrogen-containing gas into the reaction chamber 4 is stopped, and the interior of the reaction tube 10 is vacuumized, purged with the inert gas, or the like to remove any residual gas in the reaction tube 10. Then, after the in-furnace pressure is returned to the atmospheric pressure and the in-furnace temperature is lowered to a predetermined temperature, the boat 3 supporting the processed wafers 6 is unloaded from the interior of the reaction chamber 4 (boat unloading). The boat 3 stands by at a predetermined position until processed wafers 6 supported by the boat 3 are cooled. When the processed wafers 6 held in the boat 3, which is standing by, are cooled to a predetermined temperature, the processed wafers 6 are recovered by the substrate transfer machine (wafer discharge). In this way, a series of processes of oxidizing the wafer 6 are completed.

Hereinafter, actions of the present disclosure will be described.

In the embodiments of the present disclosure, since the side dummy substrates SD are held in the upper dummy arrangement region SD-T and the lower dummy arrangement region SD-U of the boat 3, a consumption amount of atomic oxygen groups in these regions is small during an oxide film formation process. Therefore, by controlling the flow rate of the hydrogen-containing gas supplied from the hydrogen-containing gas supply nozzle 8*b* and the flow rate of the inert gas supplied from the inert gas supply nozzle 8*c*, the concentration of the hydrogen-containing gas in the lower dummy arrangement region SD-U is lower than the concentration of the hydrogen-containing gas in the wafer arrangement region PW.

Figure 4A:
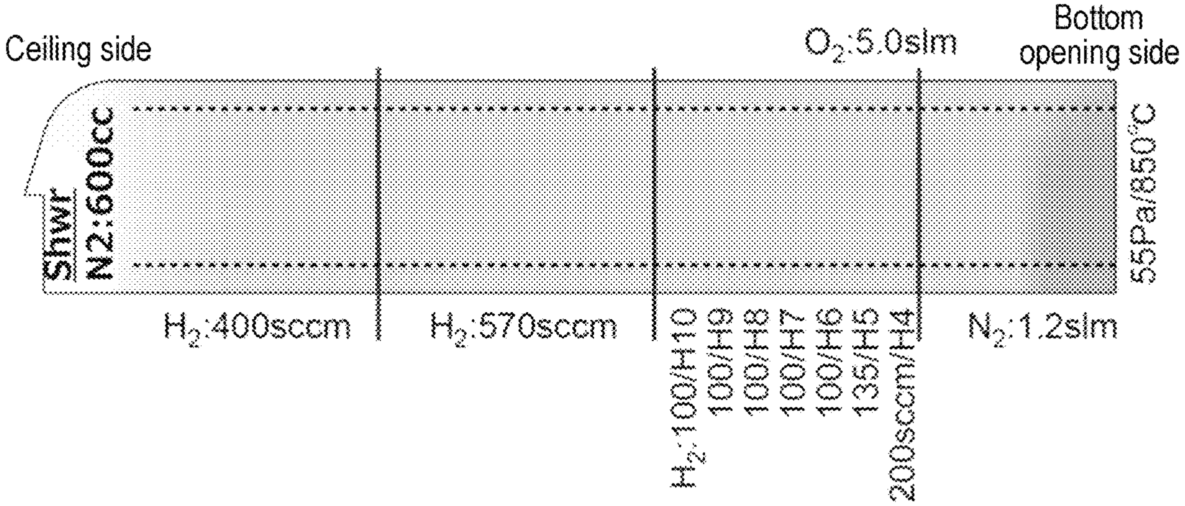
FIG. 4A is a diagram illustrating a concentration distribution of atomic oxygen in a reaction tube upon a film-forming processing of a first embodiment of the present disclosure.
Figure 4B:
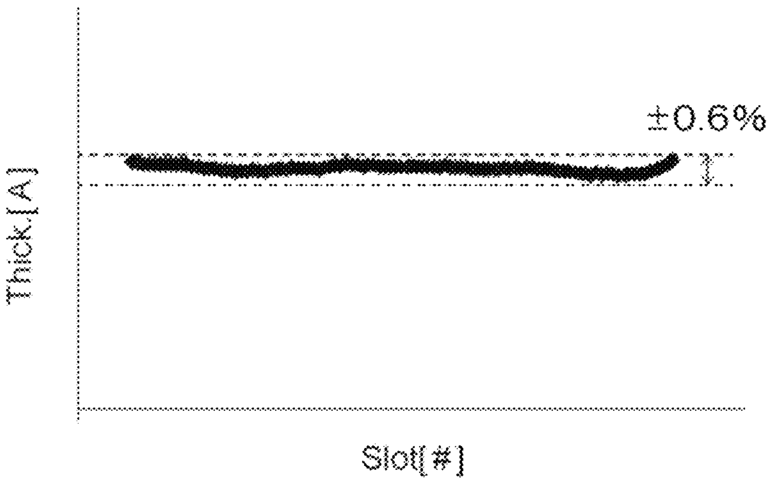
FIG. 4B is a graph illustrating a distribution of film thickness variation in the reaction tube upon the film-forming processing in the first embodiment of the present disclosure.

FIG. 4A shows a flow rate of gas supplied from each nozzle to the reaction tube 10 and a concentration distribution of atomic oxygen. FIG. 4B shows a graph of a film thickness (vertical axis) at the support position #N (horizontal axis). These results are obtained by a simulation under a condition that the reaction tube 10 is at a processing pressure of 55 Pa and a temperature of 850 degrees C. At this time, the inert gas of 1.2 slm is injected from the injection holes H1 and H2, the hydrogen-containing gas of 200 sccm is injected from the injection hole H4, the hydrogen-containing gas of 135 sccm is injected from the injection hole H5, the hydrogen-containing gas of 100 sccm is injected from each of the injection holes H6 to H10, the hydrogen-containing gas of a total of 570 sccm is injected from the injection holes H11 to H15, the hydrogen-containing gas of a total of 400 sccm is injected from the injection holes H16 to H20, and the inert gas of 600 sccm is injected from the shower plate 12. Further, the oxygen-containing gas of a total of 5.0 slm is injected from the oxygen-containing gas supply nozzle 8*a*.

The concentration of atomic oxygen in the reaction tube is almost uniform in the wafer arrangement region PW and a difference in the concentration at a boundary portion with the wafer arrangement region PW is small. Although the concentration of atomic oxygen is high in the lower dummy arrangement region SD-U in which the consumption of atomic oxygen is low, diffusion of an atomic oxygen component from the lower dummy arrangement region SD-U to the wafer arrangement region PW is prevented by the inert gas injected from the inert gas supply nozzle 8*c*. Further, the film thickness of the formed oxide film also varies within ±0.6% throughout the support positions.

In this way, the loading effect in which the film thickness of the oxide film formed on the wafer 6 varies depending on the support position may be reduced.

Figure 5:
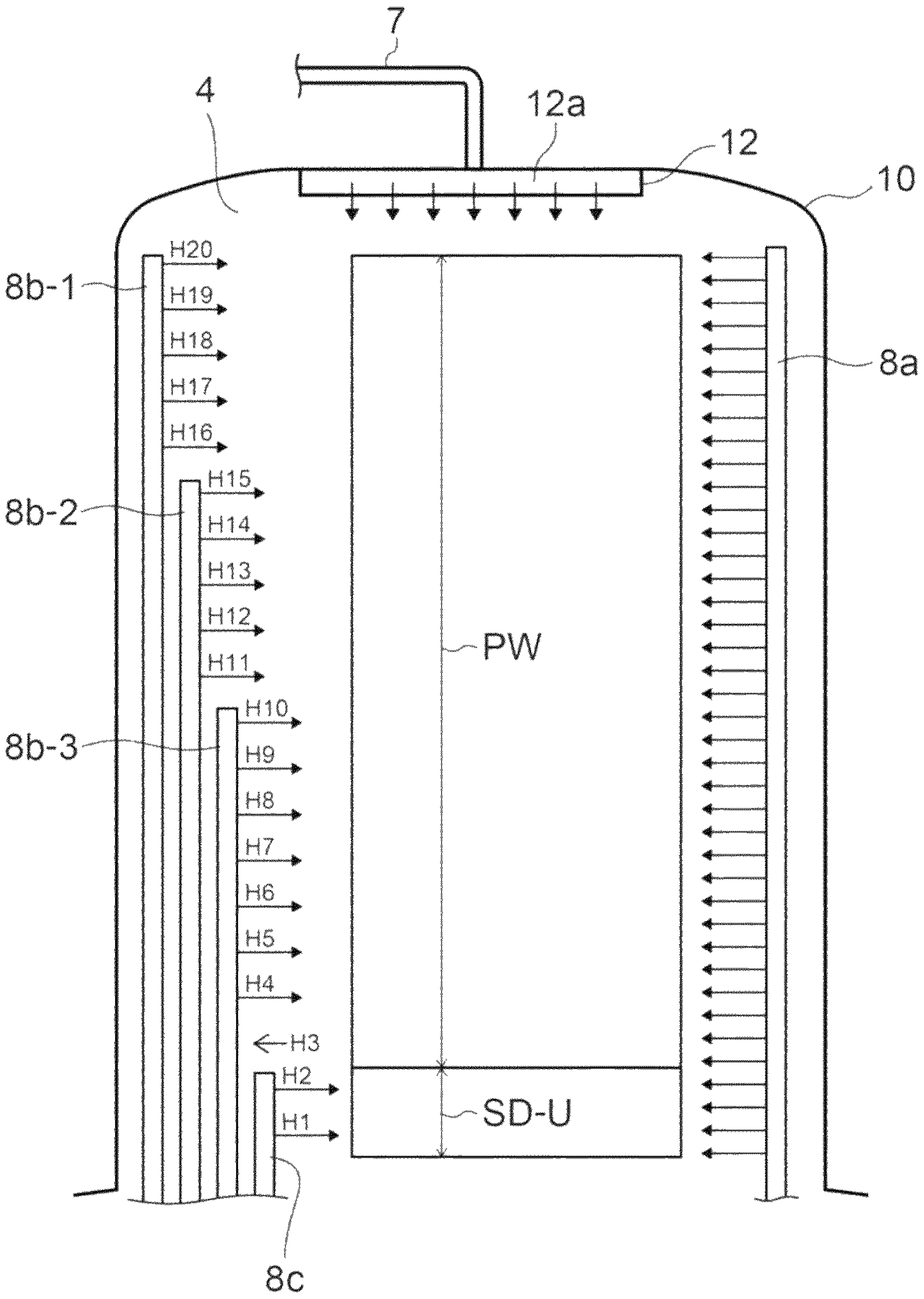
FIG. 5 is a schematic cross-sectional view illustrating another internal structure of a reaction tube of a substrate processing apparatus.

In addition, in the embodiments of the present disclosure, the side dummy substrates SD are loaded in the upper dummy arrangement region SD-T, but as illustrated in FIG. 5, no side dummy substrate SD may be arranged therein by upper side filling of the wafers 6. In this case, there is no upper dummy arrangement region SD-T, and an end on the side of the ceiling 4B becomes the wafer arrangement region PW.

Second Embodiment

Next, a second embodiment of the present disclosure will be described. The second embodiment differs from the first embodiment in that a heat insulator DP is used, and other structures are the same as those of the first embodiment.

Figure 6:
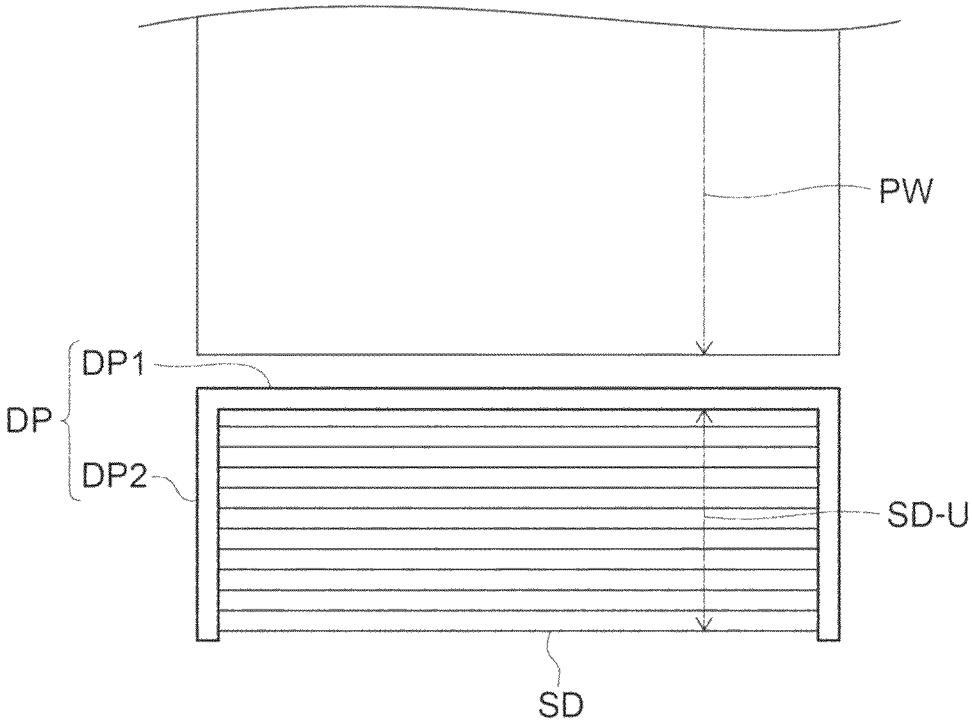
FIG. 6 is a schematic cross-sectional view illustrating a portion where a heat insulator is arranged in a reaction tube.

As illustrated in FIG. 6, the side dummy substrates SD arranged in the lower dummy arrangement region SD-U are covered with the heat insulator DP. A quartz plate may be used as the heat insulator. The heat insulator DP includes a disc-shaped portion DP1 covering the plate surface of the side dummy substrates SD and a cylindrical portion P2 connected to the lower side of the disc-shaped portion DP1.

Figure 7A:
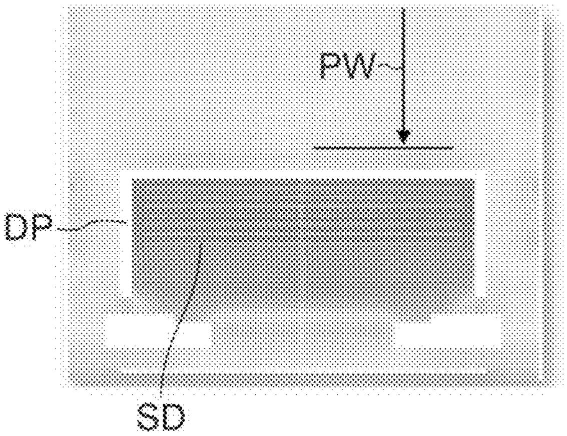
FIG. 7A is a diagram illustrating a second embodiment of the present disclosure, in which a concentration distribution of atomic oxygen when a heat insulator is arranged in a reaction tube is shown.
Figure 7B:
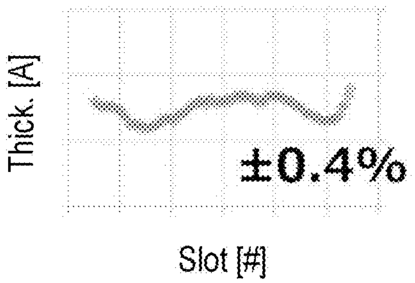
FIG. 7B illustrates the second embodiment of the present disclosure and is a graph illustrating a distribution of film thickness variation when the heat insulator is arranged in the reaction tube.
Figure 7C:
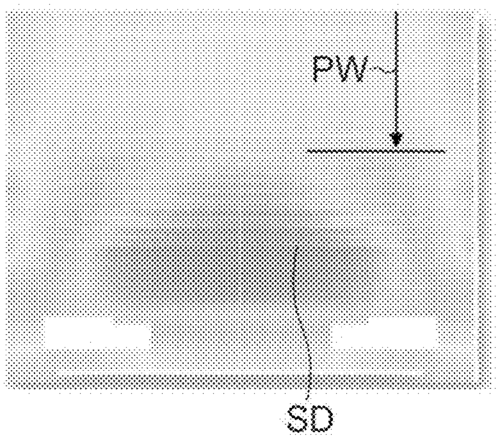
FIG. 7C illustrates the second embodiment of the present disclosure and is a diagram illustrating a concentration distribution of atomic oxygen when no heat insulator is arranged in the reaction tube.
Figure 7D:
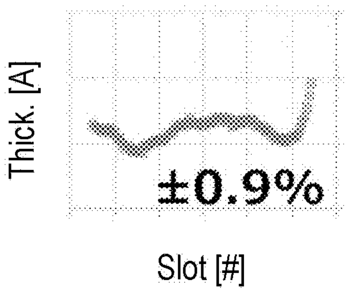
FIG. 7D illustrates the second embodiment of the present disclosure and is a graph illustrating a distribution of film thickness variation when no heat insulator is arranged in the reaction tube.

FIGS. 7A to 7D show the concentration distribution of atomic oxygen near the lower dummy arrangement region SD-U during an oxide film formation processing in shading. The darker grayscale indicates a higher concentration of atomic oxygen. FIG. 7A shows a case where the heat insulator DP is arranged, and FIG. 7C shows a case where no heat insulator DP is arranged. Further, FIG. 7B shows a film thickness variation when the heat insulator DP is arranged, and FIG. 7D shows a film thickness variation when no heat insulator DP is arranged. When the heat insulator DP is arranged, the diffusion of the atomic oxygen component from the lower dummy arrangement region SD-U to the wafer arrangement region PW is prevented. Then, a film thickness variation of the oxide film formed on the wafer 6 is ±0.4% when the heat insulator DP is arranged, which is more prevented than ±0.9% when no heat insulator DP is arranged.

Accordingly, the loading effect in which the film thickness varies depending on the support position of the wafer 6 may be reduced, which further improves the uniformity of the film thickness.

In addition, in the embodiments of the present disclosure, the example in which the side dummy substrates SD are covered with the heat insulator DP is described above, but a heat insulating plate instead of the side dummy substrates SD may be covered with the heat insulator DP. That is, the heat insulating plate may be arranged in the lower dummy arrangement region SD-U, and the insulating plate may be covered with the heat insulator DP.

Third Embodiment

Next, a third embodiment of the present disclosure will be described. In the third embodiment, a case where the number of product wafers 6 held in the boat 3 is relatively small and a fill dummy substrate FD is used will be described. An apparatus structure including the substrate processing apparatus S, the heat treatment furnace 5, the reaction tube 10, and various gas supply nozzles and the like is the same as that of the first embodiment.

The third embodiment is a case where an arbitrary number of product wafers 6 in a relatively small lot is processed in one batch, and for example, 25, 50, and 75 wafers 6 are processed.

Figure 8:
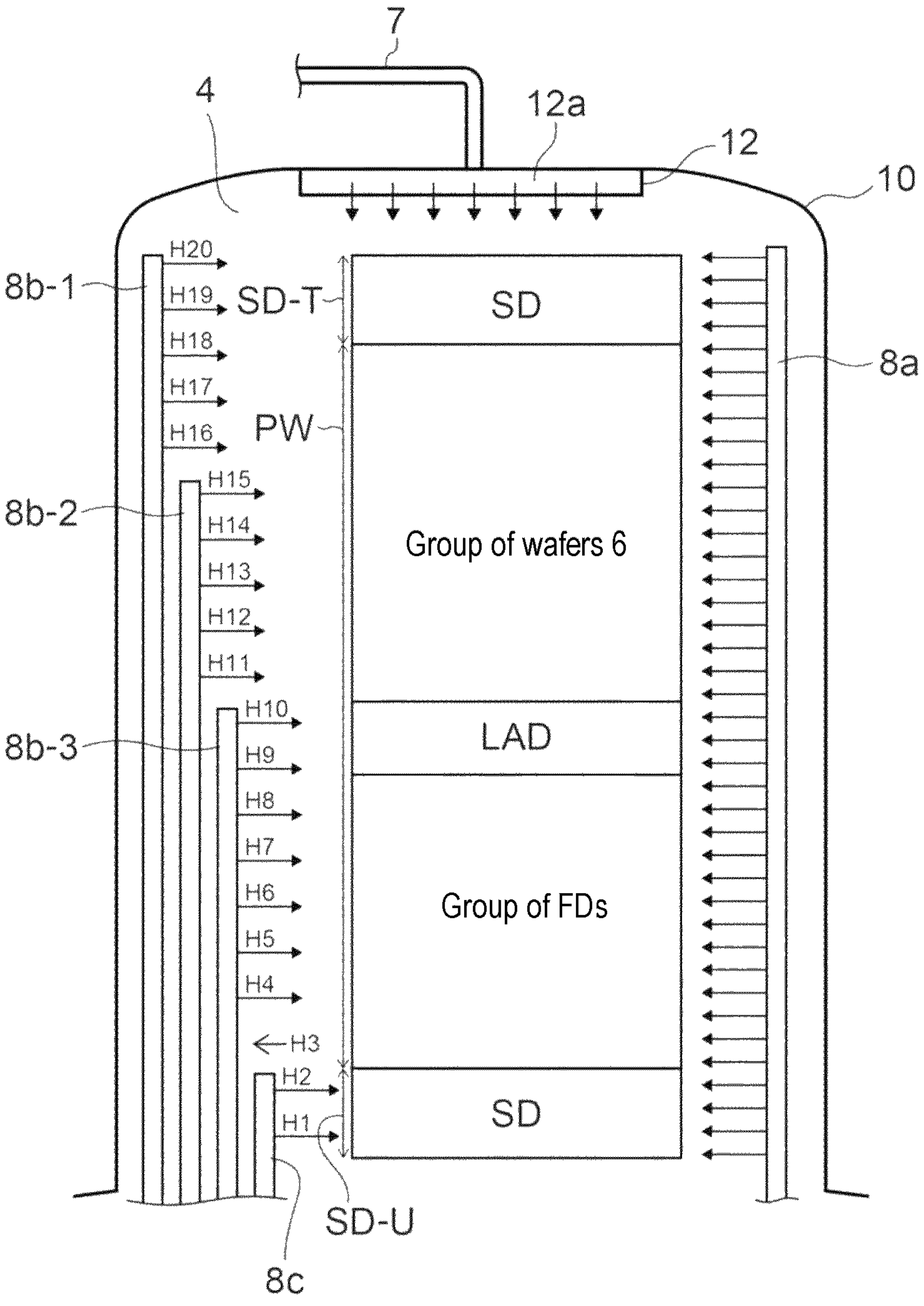
FIG. 8 is a schematic cross-sectional view illustrating an internal structure of a reaction tube according to a third embodiment of the present disclosure.

FIG. 8 shows the arrangement of the side dummy substrates SD, the wafers 6 (product wafers), and the fill dummy substrates FD in the reaction tube 10.

The wafers 6 are arranged in the wafer arrangement region PW by ceiling side filling. A large area dummy LAD is arranged on the side of the bottom opening 4A of a group of the wafers 6. The large area dummy LAD is dummy substrates with a surface area around 1.5 times (1.2 to 1.8 times) that of the product wafers 6. About 10 large area dummy LAD are arranged in the boat 3.

The fill dummy substrates FD are arranged between a group of large area dummy LAD and the side dummy substrate SD arranged in the lower dummy arrangement region SD-U. The fill dummy substrates FD fill a space of the boat 3 in which no wafer 6 is held.

As in this embodiment, by loading the large area dummy LAD between a group of product wafers 6 and a group of fill dummy substrates FD, an influence of surplus atomic oxygen component in a region on the side of the fill dummy substrates FD may be prevented.

Figure 9:
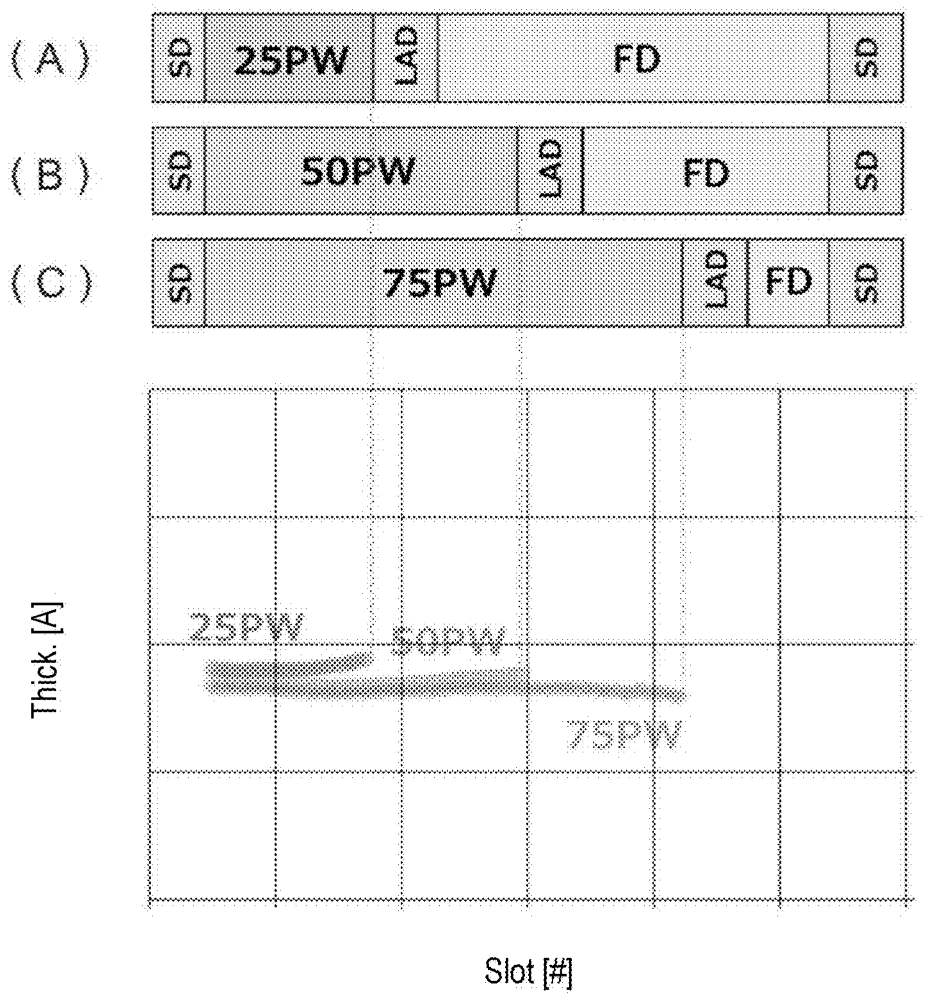
FIG. 9 is a graph illustrating an arrangement of wafers and the like and a distribution of film thickness variation according to the third embodiment of the present disclosure.

FIG. 9 shows arrangements in cases where 25 wafers 6 (A), 50 wafers 6 (B), and 75 wafers 6 (C) are processed, respectively. The left side of FIG. 8 is near the ceiling 4B of the reaction tube 10, and the right side is near the bottom opening 4A. FIG. 9 shows a graph of the film thickness (vertical axis) at the support position #N (horizontal axis) when a film-forming processing is performed in these arrangements. The film thickness distribution is suppressed to fall within ±1.0% for any number of product wafers 6.

Fourth Embodiment

Figure 10:
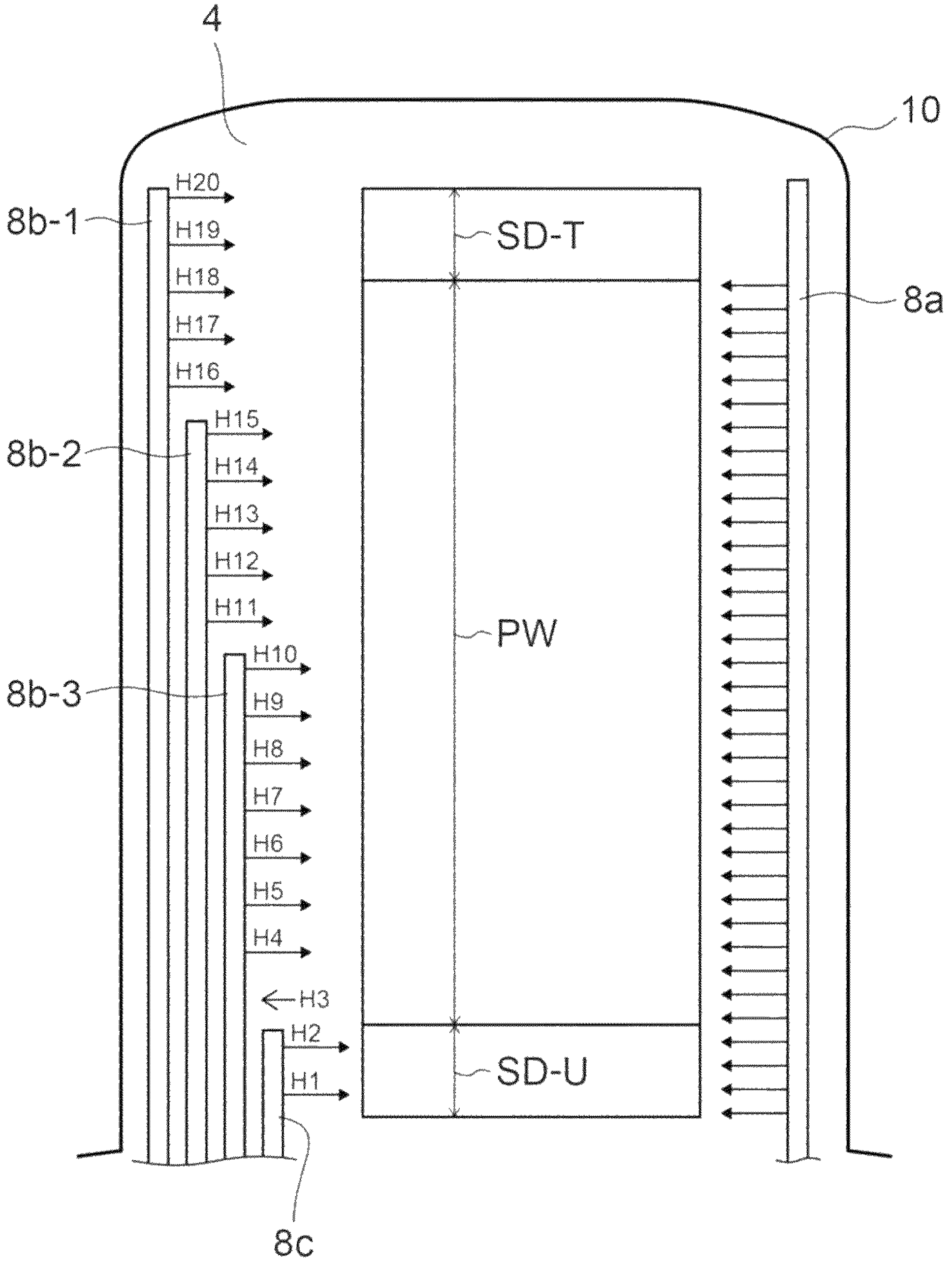
FIG. 10 is a schematic cross-sectional view illustrating an internal structure of the reaction tube according to the third embodiment of the present disclosure.

Next, a fourth embodiment of the present disclosure will be described. As illustrated in FIG. 10, the fourth embodiment includes no structure configured to supply the inert gas to the ceiling 4B of the reaction tube 10. Further, the injection holes of the oxygen-containing gas supply nozzle 8*a* are not formed in a portion corresponding to the upper dummy arrangement region SD-T.

In the above-described structure, the hydrogen-containing gas is supplied and the oxygen-containing gas is not supplied toward the upper dummy arrangement region SD-T. Thus, in the upper dummy arrangement region SD-T, the concentration of the oxygen-containing gas is lowered and a hydrogen-rich state is obtained with respect to the maximum point described above, such that the concentration of atomic oxygen may be effectively lowered. In addition, for example, when a $H_2$ gas is used as the hydrogen-containing gas, in a hydrogen-deficient state in which the film-forming rate is controlled by the supply amount of the hydrogen-containing gas, characteristics of easy diffusion of the $H_2$ gas may affect, and the concentration of atomic oxygen may hardly be lowered even in a case the hydrogen-containing gas is not locally supplied to the upper dummy arrangement region SD-T or the supply amount of the oxygen-containing gas is doubled.

The concentration of atomic oxygen is relatively lowered in the upper dummy arrangement region SD-T, such that the influence of the surplus atomic oxygen component on the wafer 6 may be reduced. Therefore, the loading effect may be improved by reducing the film thickness variation. The fourth embodiment may be suitably used when the height of the upper dummy arrangement region SD-T does not change even in a case where the number of processed wafers changes.

The above-described embodiments and modifications may be used in combination as appropriate. Processing procedures and processing conditions at this time may be the same as those in the above-described embodiments and modifications, for example. The technique of the present disclosure may be suitably applied to oxidation of silicon-based substrates such as Si, SiC, and SiGe, and may also be widely applied to deposition of films such as metal oxide films for which an oxidizing precursor is used.

According to the embodiments of the present disclosure, it is possible to provide a technique capable of improving uniformity of a thickness of an oxide film regardless of an arrangement position of a substrate.

What is claimed is:

1. A substrate processing apparatus comprising:

a reaction tube including a bottom opening through which a plurality of substrates are loaded and unloaded, the reaction tube being configured to process the plurality of substrates held by a holder in a substrate arrangement region;

a first nozzle arranged to correspond to a first region in which a plurality of product substrates are arranged in the substrate arrangement region, the first nozzle being configured to supply a hydrogen-containing gas into the reaction tube from a plurality of locations corresponding to the first region;

a second nozzle arranged to correspond to the first region, the second nozzle being configured to supply an oxygen-containing gas into the reaction tube from a position corresponding to the first region;

a third nozzle arranged closer to the bottom opening than the first region to correspond to a second region in which a plurality of dummy substrates held by the holder are arranged, the third nozzle being configured to supply a dilution gas into the reaction tube from a position corresponding to the second region;

an exhaust port configured to exhaust an interior of the reaction tube; and a controller configured to be capable of controlling the hydrogen-containing gas supplied from the first nozzle and the dilution gas supplied from the third nozzle such that a concentration of the hydrogen-containing gas in the second region is lower than a concentration of the hydrogen-containing gas in the first region, wherein the first nozzle includes a plurality of multi-hole nozzles including injection holes corresponding to a divided region obtained by dividing a region including the first region and not including the second region in a substrate arrangement direction, wherein the reaction tube includes a ceiling gas supplier installed at a ceiling that is a closed end opposite to the bottom opening, the ceiling gas supplier being configured to supply an inert gas into the reaction tube, wherein the second nozzle includes injection holes corresponding to the product substrates arranged in the first region in a one-to-one relationship, wherein the injection holes of the second nozzle are not arranged to correspond to a third region in which a plurality of dummy substrates are arranged in the substrate arrangement region to be closest to the ceiling, and wherein a part of the injection holes of the first nozzle are arranged to correspond to the third region.

2. The substrate processing apparatus of claim 1, wherein a distance in a height direction between an injection hole at an upper end of the third nozzle and an injection hole at a lower end of the first nozzle is greater than any one of distances between adjacent injection holes of the first nozzle.

3. The substrate processing apparatus of claim 1, wherein, among the plurality of multi-hole nozzles, the injection holes of the multi-hole nozzle including an injection hole closest to the bottom opening are opened or spaced apart such that a discharge amount per unit length monotonously increases toward the bottom opening rather than a ceiling of the reaction tube.

4. The substrate processing apparatus of claim 1, further comprising a gas supply port configured to supply the dilution gas into the reaction tube from a ceiling of the reaction tube, wherein the exhaust port is installed below the first region.

5. The substrate processing apparatus of claim 1, wherein the divided region is divided such that 25 substrates or a multiple of 25 substrates are arranged in the divided region.

6. The substrate processing apparatus of claim 1, wherein a plurality of heat insulators are arranged in the second region, and wherein the substrate processing apparatus further comprises a cover configured to collectively cover the plurality of dummy substrates or the plurality of heat insulators or both in the second region.

7. The substrate processing apparatus of claim 1, wherein the dilution gas is an inert gas or an oxygen-containing gas.

8. The substrate processing apparatus of claim 1, wherein the injection holes of the first nozzle and injection holes of the second nozzle are configured such that as for a rate of diffusion and convection in movement of gas molecules from a rim to a center of each of the substrates, a convection rate of the oxygen-containing gas is higher than a convection rate of the hydrogen-containing gas.

9. The substrate processing apparatus of claim 1, wherein at least one selected from the group of: (i) the injection holes of the first nozzle and (ii) injection holes of the second nozzle are opened in a direction parallel to the substrates.

10. The substrate processing apparatus of claim 1, wherein at least one selected from the group of: (i) the injection holes of the first nozzle and (ii) injection holes of the second nozzle are opened toward centers of the substrates.

11. The substrate processing apparatus of claim 1, wherein the number of the injection holes of the first nozzle is less than the number of injection holes of the second nozzle.

12. The substrate processing apparatus of claim 1, wherein injection holes of the second nozzle are provided to at least correspond to the plurality of product substrates arranged in the first region respectively.

13. A method of processing a substrate, the method comprising:

loading a plurality of substrates into a reaction tube via a bottom opening and holding the plurality of substrates in a substrate arrangement region; and processing the substrates by supplying a hydrogen-containing gas into the reaction tube from a plurality of locations corresponding to a first region, in which a plurality of product substrates are arranged, in the substrate arrangement region, from a first nozzle arranged to at least correspond to the first region, supplying an oxygen-containing gas into the reaction tube from a position corresponding to the first region from a second nozzle arranged to correspond to the first region, and supplying a dilution gas into the reaction tube from a position corresponding to a second region, in which a plurality of dummy substrates are arranged closer to the bottom opening than the first region, from a third nozzle arranged to correspond to the second region, wherein, in the act of processing the substrates, the supply of the hydrogen-containing gas from the first nozzle and the supply of the dilution gas from the third nozzle are controlled such that a concentration of the hydrogen-containing gas in the second region is lower than a concentration of the hydrogen-containing gas in the first region, wherein an interior of the reaction tube is exhausted, wherein the hydrogen-containing gas is supplied from the first nozzle including a plurality of multi-hole nozzles including injection holes corresponding to a divided region obtained by dividing a region including the first region and not including the second region in a substrate arrangement direction, wherein the reaction tube includes a ceiling gas supplier installed at a ceiling that is a closed end opposite to the bottom opening, the ceiling gas supplier being configured to supply an inert gas into the reaction tube, wherein the second nozzle includes injection holes corresponding to the product substrates arranged in the first region in a one-to-one relationship, wherein the injection holes of the second nozzle are not arranged to correspond to a third region in which a plurality of dummy substrates are arranged in the substrate arrangement region to be closest to the ceiling, and wherein a part of the injection holes of the first nozzle are arranged to correspond to the third region.

14. A method of manufacturing a semiconductor device, comprising:

loading a plurality of substrates into a reaction tube via a bottom opening and holding the plurality of substrates in a substrate arrangement region; and processing the substrates by supplying a hydrogen-containing gas into the reaction tube from a plurality of locations corresponding to a first region, in which a plurality of product substrates are arranged, in the substrate arrangement region, from a first nozzle arranged to at least correspond to the first region, supplying an oxygen-containing gas into the reaction tube from a position corresponding to the first region from a second nozzle arranged to correspond to the first region, and supplying a dilution gas into the reaction tube from a position corresponding to a second region, in which a plurality of dummy substrates are arranged closer to the bottom opening than the first region, from a third nozzle arranged to correspond to the second region, wherein, in the act of processing the substrates, the supply of the hydrogen-containing gas from the first nozzle and the supply of the dilution gas from the third nozzle are controlled such that a concentration of the hydrogen-containing gas in the second region is lower than a concentration of the hydrogen-containing gas in the first region, wherein an interior of the reaction tube is exhausted, wherein the hydrogen-containing gas is supplied from the first nozzle including a plurality of multi-hole nozzles including injection holes corresponding to a divided region obtained by dividing a region including the first region and not including the second region in a substrate arrangement direction, wherein the reaction tube includes a ceiling gas supplier installed at a ceiling that is a closed end opposite to the bottom opening, the ceiling gas supplier being configured to supply an inert gas into the reaction tube, wherein the second nozzle includes injection holes corresponding to the product substrates arranged in the first region in a one-to-one relationship, wherein the injection holes of the second nozzle are not arranged to correspond to a third region in which a plurality of dummy substrates are arranged in the substrate arrangement region to be closest to the ceiling, and wherein a part of the injection holes of the first nozzle are arranged to correspond to the third region.

15. A non-transitory computer-readable recording medium storing a program that is operated on a computer to control a substrate processing apparatus, wherein the program causes, when executed, the computer to control the substrate processing apparatus such that a process comprising the method of claim 13 is performed.

* * * * *